United States Patent [19]

Christie et al.

[11] Patent Number: 5,250,848

[45] Date of Patent: * Oct. 5, 1993

[54] SOLDER INTERCONNECTION STRUCTURE

[75] Inventors: Frederick R. Christie; Kostas I. Papathomas, both of Endicott; David W. Wang, Vestal, all of N.Y.

[73] Assignee: International Business Machines Corporation, Armonk, N.Y.

[ * ] Notice: The portion of the term of this patent subsequent to Mar. 12, 2008 has been disclaimed.

[21] Appl. No.: 737,473

[22] Filed: Jul. 30, 1991

Related U.S. Application Data

[60] Continuation of Ser. No. 624,973, Dec. 10, 1990, Pat. No. 5,089,440, which is a division of Ser. No. 493,126, Mar. 14, 1990, Pat. No. 4,999,699.

[51] Int. Cl.$^5$ .............. H01L 23/48; H01L 29/40; H01L 29/64; H01L 39/02
[52] U.S. Cl. .............. 257/778; 257/687; 257/786; 257/793; 228/180.1; 228/180.22; 428/411.1; 428/422.8; 525/107; 525/122; 528/210; 528/211; 528/422; 361/765
[58] Field of Search ........ 357/65, 80; 428/422.8, 428/411.1; 525/107, 122; 528/210, 211, 422; 257/687, 778, 786, 793; 361/401, 402; 228/180.1, 180.2

[56] References Cited

U.S. PATENT DOCUMENTS

| | | | |
|---|---|---|---|
| 3,949,125 | 4/1976 | Roberts | 428/99 |
| 4,199,412 | 4/1980 | Battaglia et al. | 357/23.15 |
| 4,504,283 | 3/1985 | Charvat | 51/298 |
| 4,579,806 | 4/1986 | Schupp et al. | 430/280 |
| 4,604,644 | 8/1986 | Beckham et al. | 357/80 |
| 4,740,584 | 4/1988 | Shimp | 528/422 |
| 4,999,699 | 3/1991 | Christie et al. | 357/65 |
| 5,089,440 | 2/1992 | Christie et al. | 437/209 |
| 5,121,190 | 6/1992 | Hsiao et al. | 357/80 |

FOREIGN PATENT DOCUMENTS 0111125 1/1989 Japan.

OTHER PUBLICATIONS

Chemical Abstracts, 164236A, vol. 82, 1975, p. 573.

Primary Examiner—Rolf Hille
Assistant Examiner—David Ostrowski
Attorney, Agent, or Firm—Pollock, Vande Sande & Priddy

[57] ABSTRACT

Solder interconnection whereby the gap created by solder connections between a carrier substrate and semiconductor device is filled with a composition obtained from curing a preparation containing a cycloaliphatic polyepoxide and/or curable cyanate ester or prepolymer thereof; filler having a maximum particle size of 31 microns and being at least substantially free of alpha particle emissions.

24 Claims, 1 Drawing Sheet

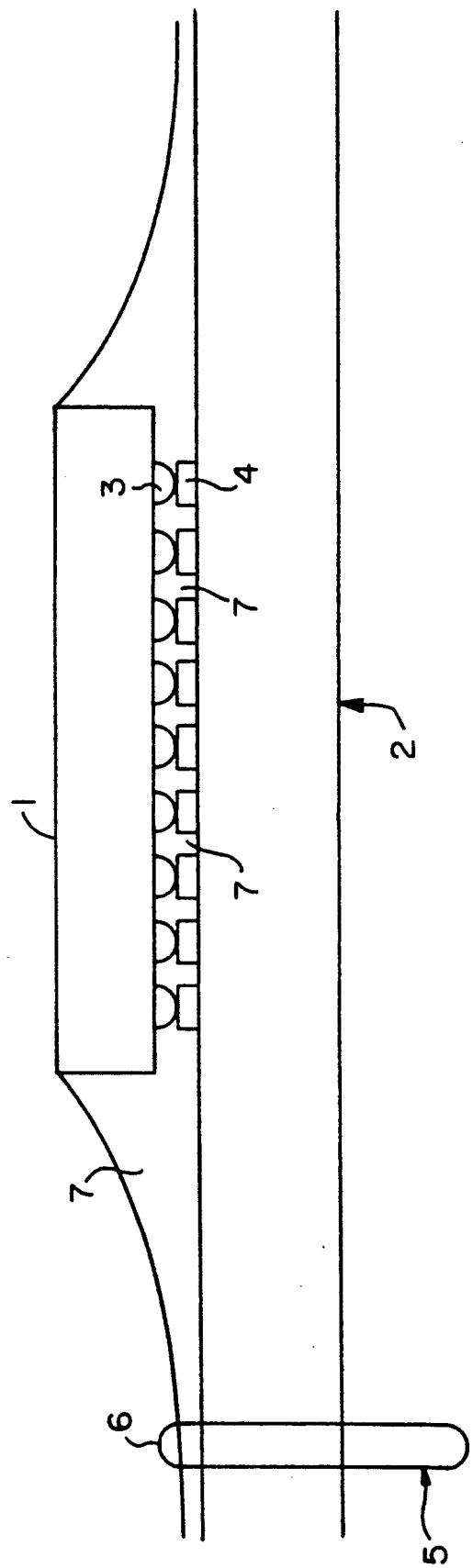

SOLDER INTERCONNECTION STRUCTURE

CROSS REFERENCE TO RELATED APPLICATIONS

This is a continuation of co-pending application Ser. No. 07/624,973 filed Dec. 10, 1990 now U.S. Pat. No. 5,089,440, which in turn is a divisional application of Ser. No. 07/493,126 filed Mar. 14, 1991 which is now U.S. Pat. No. 4,999,699.

DESCRIPTION

1. Technical Field

The present invention is concerned with interconnection structures for joining an integrated semiconductor device to a carrier substrate and particularly to a structure for forming solder interconnection joints that exhibit improved fatigue life and stability. The present invention is especially concerned with so-called "controlled collapse chip connection" or "C4" that employs solder-bump interconnections. Such is also referred to as the face down or flip-chip bonding. The present invention is also concerned with a method of making the interconnection structure.

2. Background Art

Controlled collapse chip connection (C4) or flip-chip technology has been successfully used for over twenty years for interconnecting high I/O (input/output) count and area array solder bumps on the silicon chips to the base ceramic chip carriers, for example alumina carriers. The solder bump, typically a 95 Pb/5 Sn alloy, provides the means of chip attachment to the ceramic chip carrier for subsequent usage and testing. For example, see U.S. Pat. Nos. 3,401,126 and 3,429,040 to Miller and assigned to the assignee of the present application, for a further discussion of the controlled collapse chip connection (C4) technique of face down bonding of semiconductor chips to a carrier. Typically, a malleable pad of metallic solder is formed on the semiconductor device contact site and solder joinable sites are formed on the conductors on the chip carrier.

The device carrier solder joinable sites are surrounded by non-solderable barriers so that when the solder on the semiconductor device contact sites melts, surface tension of the molten solder prevents collapse of the joints and thus holds the semiconductor device suspended above the carrier. With the development of the integrated circuit semiconductor device technology, the size of individual active and passive elements have become very small, and the number of elements in the device has increased dramatically. This results in significantly larger device sizes with larger numbers of I/O terminals. This trend will continue and will place increasingly higher demands on device forming technology. An advantage of solder joining a device to a substrate is that the I/O terminals can be distributed over substantially the entire top surface of the semiconductor device. This allows an efficient use of the entire surface, which is more commonly known as area bonding.

Usually the integrated circuit semiconductor devices are mounted on supporting substrates made of materials with coefficients of expansion that differ from the coefficient of expansion of the material of the semiconductor device, i.e. silicon. Normally the device is formed of monocrystalline silicon with a coefficient of expansion of $2.5 \times 10^{-6}$ per °C. and the substrate is formed of a ceramic material, typically alumina with a coefficient of expansion of $5.8 \times 10^{-6}$ per °C. In operation, the active and passive elements of the integrated semiconductor device inevitably generate heat resulting in temperature fluctuations in both the devices and the supporting substrate since the heat is conducted through the solder bonds. The devices and the substrate thus expand and contract in different amounts with temperature fluctuations, due to the different coefficients of expansion. This imposes stresses on the relatively rigid solder terminals.

The stress on the solder bonds during operation is directly proportional to (1) the magnitude of the temperature fluctuations, (2) the distance of an individual bond from the neutral or central point (DNP), and (3) the difference in the coefficients of expansion of the material of the semiconductor device and the substrate, and inversely proportional to the height of the solder bond, that is the spacing between the device and the support substrate. The seriousness of the situation is further compounded by the fact that as the solder terminals become smaller in diameter in order to accommodate the need for greater density, the overall height decreases.

More recently, an improved solder interconnection structure with increased fatigue life has been disclosed in U.S. Pat. No. 4,604,644 to Beckham, et al. and assigned to the assignee of the present application, disclosure of which is incorporated herein by reference. In particular, U.S. Pat. No. 4,604,644 discloses a structure for electrically joining a semiconductor device to a support substrate that has a plurality of solder connections where each solder connection is joined to a solder wettable pad on the device and a corresponding solder wettable pad on the support substrate, dielectric organic material disposed between the peripheral area of the device and the facing area of the substrate, which material surrounds at least one outer row and column of solder connections but leaves the solder connections in the central area of the device free of dielectric organic material.

The preferred material disclosed in U.S. Pat. No. 4,604,644 is obtained from a polyimide resin available commercially and sold under the trademark AI-10 by Amoco Corporation. AI-10 is formed by reacting a diamine such as p,p'diaminodiphenylmethane with trimellitic anhydride or acylchloride of trimellitic anhydride. The polymer is further reacted with gamma-amino propyl triethoxy silane (AI1100) or β-(3,4-epoxy cyclohexyl) ethyltrimethoxy silane (A-186) from Dow Corning. The coating material is described in IBM TDB Sep. 1970 P. 825.

The dielectric material is typically applied by first mixing it with a suitable solvent and then dispensing it along the periphery of the device where it can be drawn in between the device and substrate by capillary action.

Although the above techniques have been quite successful, there still remains room for improvement in extending the fatigue life.

SUMMARY OF THE INVENTION

The present invention is concerned with enhancing the fatigue life of C4 solder connections. The present invention provides an encapsulant that exhibits excellent wetting and coverage of the C4 connections as well as the pin heads under the device that are present. In fact, the present invention makes it possible to achieve complete coverage beneath the chip. The encapsulant employed pursuant to the present invention exhibits even and adequate flow under the semiconductor device as contrasted to prior encapsulants that do not adequately cover the C4 connections or pin heads.

In particular, the present invention is concerned with solder interconnection for forming connections between an integrated semiconductor device and a carrier substrate. The solder interconnection includes a plurality of solder connections that extend from the carrier substrate to electrodes on the semiconductor device to form a gap between the carrier substrate and the semiconductor device. The gap is filled with a composition obtained from curing a curable composition containing a binder which is a cycloaliphatic polyepoxide and/or a cyanate ester or prepolymer thereof and a filler. The cycloaliphatic polyepoxide, cyanate ester and cyanate ester prepolymer employed have viscosities at normal room temperatures (25° C.) of no greater than about 1000 centipoise. The filler has a maximum particle size of 31 microns and is substantially free of alpha particle emissions. The amount of binder (i.e. —epoxy and/or cyanate ester) is about 60 to about 25 percent by weight of the total of the binder and filler and, correspondingly, the filler is about 40 to about 75 percent by weight of the total of the binder and filler.

In addition, the present invention is concerned with a method of increasing the fatigue life of solder interconnections between a semiconductor device and a supporting substrate. The method includes attaching the device to the substrate by a plurality of solder connections that extend from the supporting substrate to electrodes on the semiconductor device to form a gap between the supporting substrate and the semiconductor device. The gap is filled with the above disclosed binder-filler composition and the composition is cured.

SUMMARY OF DRAWINGS

The FIGURE is a schematic diagram of a solder pursuant to the present invention.

BEST AND VARIOUS MODES FOR CARRYING OUT INVENTION

To facilitate understanding of the present invention, reference is made to the FIGURE. In the FIGURE, numeral 1 represents a semiconductor chip joined to the chip carrier 2 by solder bumps 3 mated to pads 4. I/O pins 5 extend and protrude from the carrier 2, with a small portion 6 of the pins protruding from the other side of the carrier for carrying current thereto. When the carrier is an organic substrate, the pins (6) as such are not required. Instead, electrically conductive circuitry and interconnections would be provided such as at the periphery of substrate for connection to a desired structure. The encapsulant 7 pursuant to the present invention provides for essentially void free encapsulation of the solder connections thereby assuring highly reliable devices and fills the gap forming a uniform fillet around the chip as well as covering the pin heads under the device (not shown).

The encapsulant composition of the present invention must contain a binder selected from the group of cycloaliphatic polyepoxide, cyanate ester, prepolymer of cyanate ester or mixtures thereof.

The cycloaliphatic epoxides are known and can be obtained by oxidation of cyclic olefins. Examples of cycloaliphatic epoxides are suggested in U.S. Pat. Nos. 3,027,357; 2,890,194; 2,890,197; and 4,294,746, disclosures of which are incorporated herein by reference.

Some specific examples of suitable cycloaliphatic epoxides are: 3,4-epoxycyclohexylmethyl-3,4-epoxycyclohexane carboxylate, available from Union Carbide under the trade designation ERL-4221; bis (3,4-epoxycyclohexyl) adipate ERL-4299; and vinyl cyclohexane diepoxide, available from Union Carbide under the trade designation ERL-4206.

A discussion of various cycloaliphatic epoxides can be found in the publication entitled "Cycloaliphatic Epoxide Systems", Union Carbide, 1970, disclosure of which is incorporated herein by reference.

Mixtures of cycloaliphatic epoxides can be employed when desired. The preferred cycloaliphatic epoxide employed pursuant to the present invention is 3,4-epoxycyclohexylmethyl 3,4-epoxycyclohexanecarboxylate (systematic name: 7-oxabicyclo[4.1.0]heptane-3-carboxylic acid 7-oxabicyclo[4.1.0 ]hept-3-ylmethyl ester).

It is essential to the success of the present invention that the cycloaliphatic epoxide have a viscosity at 25° C. of no greater than about 1000 centipoise, preferably about 300 to about 600 centipoise and most preferably about 300 to about 450 centipoise.

The cyanate esters that can be employed pursuant to the present invention have two or more —O≡N groups and are curable through cyclotrimerization.

The cyanate esters can be monomeric or less preferably polymeric, including oligomers and can be represented by those materials containing the following group:

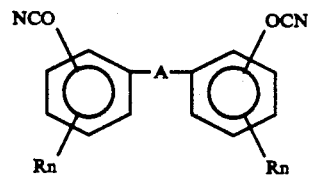

wherein A represents independently a single bond,

—SO$_2$—,—O—,—C(CF$_3$)$_2$—, divalent alkylene radicals such as —CH$_2$—and —C(CH$_3$)$_2$—; divalent alkylene radicals interrupted by hereratoms in the chain such as O, S, and N.

Each R is independently selected from the group of hydrogen, alkyl containing 1 to 9 carbon atoms:

Each n independently is an integer of 0 to 4.

Specific cyanate esters that can be employed in the present invention are available and well-known and include those discussed in U.S. Pat. Nos. 4,195,132; 3,681,292; 4,740,584; 4,745,215; 4,477,629; and 4,546,131; European patent application EPO147548/82; and German Offen. 2611796, disclosures of which are incorporated herein by reference.

An example of a suitable polyaromatic cyanate ester containing cycloaliphatic bridging group between aromatic rings is available from Dow Chemical Company under the designation "Dow XU-71787.OOL cyanate". A discussion of such can be found in Bogan, et al., "Unique Polyaromatic Cyanate Ester for Low Dielectric Printed Circuit Boards", Sampe Journal, Vol. 24, No. 6, Nov./Dec. 1988. A preferred polyfunctional cyanate ester is Bisphenol AD dicyanate (4,4'-ethylidene bisphenol dicyanate) available from Hi-Tek Polymers under the trade designation AROCY L-10.

The compositions employed pursuant to the present invention also include a filler and especially an inorganic filler. The particle size of the filler must not be greater than 31 microns or less, preferably about 0.7 to about 31 microns, and most preferably about 0.5 to about 20 microns. This is necessary so that the composition will readily flow in the gap between the chip and substrate carrier. The gap is normally about 25 to about 160 microns and preferably about 75 to about 125 microns. The preferred fillers have average particle size of about 3 to about 5 microns.

In addition, the filler must be at least substantially free of alpha particle emissions such as from the trace amounts of radioactive impurities such as uranium and thorium normally present in conventional silica or quartz fillers. The fillers employed have emission rates of less than 0.01 alpha particles/$cm^2$-hr and preferably less 0.005 alpha particles/$cm^2$-hr. The presence of $\alpha$-particle emissions primarily caused by the presence of uranium and thorium isotopes in the fillers can generate electron/hole pairs which in turn would be detrimental to the device. The preferred filler is high purity fused or amorphous silica. A commercially available filler that can be employed is DP4910 from PQ Corporation. The preferred filler can be optionally treated with a coupling agent.

The compositions of the present invention contain about 25 to about 60% by weight and preferably about 50 to about 60% by weight of the binder and correspondingly about 40 to about 75% by weight and preferably about 50 to about 60% by weight of the filler. These amounts are based upon the total amounts of binder and filler in the composition. When the binder includes the polyepoxide, the compositions employed in the present invention also include a hardening or curing agent. The preferred hardeners for the polyepoxides are the anhydrides of organic carboxylic acids. The hardening agent is preferably in liquid form. If a solid hardening agent is employed, such should be melted when added to the composition. Examples of anhydrides are methyltetrahydrophthalic anhydride; hexahydrophthalic anhydride; maleic anhydride, trimellitic anhydride; pyromellitic dianhydride, tetrahydrophthalic anhydride; phthalic anhydride; norbornenedicarboxylic anhydride; nadic methyl anhydride; and methylcyclohexane-1,2dicarboxylic anhydride.

Additional anhydrides can be found, for instance, in H. Lee and K. Neville, *Handbook of Epoxy Resin*, McGraw Hill, 1967, Chapter 12, disclosure of which is incorporated herein by reference.

The anhydride curing agent is generally employed in amounts constituting on an equivalent basis, about 20% to about 120% of the cycloaliphatic epoxide employed and preferably about 75% to about 100% of the epoxide equivalents.

Preferably the curing agent is employed in amounts of about 89 to about 110 parts by weight per hundred parts of polyepoxy (phr).

In addition to the binder and filler, the compositions can also include a catalyst to promote the polymerization of the epoxy and/or cyanate ester.

Suitable catalysts for the epoxy include amines such as the tertiary amine benzyldimethylamine, 1,3-tetramethyl butane diamine, tris (dimethylaminomethyl) phenol, pyridine, and triethylenediamine and acidic catalysts such as stannous octoate.

Suitable catalysts for the cyanate ester include Lewis acids, such as aluminum chloride, boron trifluoride, ferric chloride, titanium chloride, and zinc chloride; salts of weak acids, such as sodium acetate, sodium cyanide, sodium cyanate, potassium thiocyanate, sodium bicarbonate, and sodium boronate. Preferred catalysts are metal carboxylates and metal chelates, such as cobalt, iron, zinc, and copper acetylacetonate or octoates or naphthenates. The amount of catalyst when used can vary, and generally will be 0.005 to 5 weight percent, preferably 0.05 to 0.5 weight percent based on total solid binder weight.

Surfactants in amounts of about 0.5% to about 3% and preferably about 1.2% to about 1.6% can be used to facilitate mixing the filler with the epoxy. Suitable surfactants include silanes and non-ionic type surface active agents.

The preferred compositions of the present invention also include an organic dye in amounts less than about 0.2% to provide contrast. Suitable dyes are nigrosine and Orasol blue GN.

In the compositions that employ a cycloaliphatic epoxide, it is preferred to also employ small amounts of a reactive modifier. The purpose of the reactive modifier is to impart desirable mechanical properties to the cured composition such as flexibility and thermal shock resistance. Examples of modifiers which can be used are fatty acids, fatty acid anhydrides such as polyazelaic polyanhydride and dodecenylsuccinic anhydride, diols such as ethylene glycol, polyols, polyetherdiols such as polyethylene glycol and polypropylene glycol, and other materials having hydroxyl, carboxyl, epoxy, and/or carboxylic anhydride functionality. A preferred reactive modifier is ethylene glycol which when employed is present in amounts of about 0.7 to about 2 phr (per hundred parts by weight of the epoxy).

Ethylene glycol is employed as a source of hydroxyls to promote the reaction of anhydride with the epoxy.

The preferred compositions employed pursuant to the present invention are substantially free (e.g. - less than 0.2% by weight) if not completely free from non-reactive organic solvents. Compositions employed pursuant to the present invention have viscosity at 25° C. (Brookfield cone & plate Spindle 51, 20 RPM or equivalent) of about 3,000 to about 7,000 centipoise and preferably about 3,000 to about 10,000 centipoise. The compositions are stable for at least 12 hours. The compositions can be cured at temperatures of less than about 150.° C. and preferably about 130° C. to about 140° C. in about 2 to about 6 hours and preferably about 4 hours. The compositions when cured have alpha particle emissions of less than about 0.005 preferably less than about 0.004 counts/$cm^2$-hr and most preferably less than about 0.002 counts/$cm^2$-hr. The cured compositions also have coefficient of thermal expansion of about 25 to about 38 ppm/° C., glass transition temperature of greater than about 130° C. and preferably about 140° to about 160° C. The cured compositions have Shore D hardness of greater than 85 and preferably greater than 90, modulus of elasticity at 25° C. of greater than 250,000 psi and preferably greater than 750,000 psi; volume resistivity at 25° C. of greater than $10^{13}$ ohm-cm and preferably greater than $10^{14}$ ohm-cm, dielectric constant at 25° C. of less than 5.0 and preferably less than 4.5.

The compositions are prepared by rapidly admixing the components under vacuum usually about 5 mm Hg either using a double planetary mixer or high shear mixer to provide better and homogenous compositions.

The composition is applied by dispensing through nozzles under pressure of about 15 to about 90 psi and temperatures of about 25° to about 40° C. The compositions completely cover the C4 connections and pin heads. If desired, the compositions can be pregelled by heating for about 15 to about 60 minutes, typically about 30 minutes at about 65° to about 75° C.

The compositions are then cured by heating to about 130° to about 150° C. and preferably about 130° to about 140° C. for about 2 to about 6 and preferably about 4 to about 5 hours. The substrate employed can be an organic, inorganic or composite in nature. The preferred substrate can be a ceramic module or a multilayer printed circuit board. The preferred ceramic substrates include silicon oxides and silicates such as aluminum silicate, and aluminum oxides.

The preferred printed circuit board includes conventional FR-4 Epoxy and laminates based on high temperature resins such as high temperature epoxies, polyimides, cyanates (triazines), fluoropolymers, benzocyclobutenes, polyphenylenesulfide, polysulfones, polyetherimides, polyetherketones, polyphenyquinoxalines, polybenzoxazoles, and polyphenyl benzobisthiazoles.

The following non-limiting examples are presented to further illustrate the present invention.

EXAMPLE 1

A composition containing about 50 parts by weight of 3,4-epoxycyclohexylmethyl-3,4-epoxycyclohexanecarboxylate (Union Carbide ERL-4221), about 126 parts by weight of fused silica available under the trade designation DP4910 from PQ Corporation, and having a particle size of 31 micrometers maximum and being free of alpha particle emissions; about 49.5 parts by weight of hexahydrophthalic anhydride; about 0.5 parts by weight of benzyl dimethyl amine, about 1.0 part by weight of ethylene glycol, about 3 parts by weight of Triton X-100 (a surfactant) from Rohn & Haas and about 0.08 parts by weight of nigrosine is prepared.

The composition is dispensed at a temperature of about 30° C. in the gap of about 5 mils between a silicon chip soldered by solder bumps to 28 mm by 28 mm Al$_2$O$_3$ substrate having pins protruding therefrom. The composition is cured at about 130° C. in about 4 hours. The cured composition has a coefficient of thermal expansion of less than $35 \times 10^{-6}/°C$. The composition covers the pin heads and solder bumps.

The structures tested for fatigue life exhibit no failures when thermocycling the parts for over 10,000 cycles between 0° C. to 100° C. On the other hand, control parts filled with prior art compositions including AI-10 described hereinabove show failures at about 2000 cycles.

EXAMPLE 2

A composition containing about 50 parts by weight of 3,4-epoxycyclohexylmethyl-3,4-epoxycyclohexanecarboxylate (Union Carbide ERL-4221), about 125 parts by weight of fused silica available under the trade designation DP4910 from PQ Corporation, and having a particle size of 31 micrometers maximum and being free of alpha particle emissions; about 49.5 parts by weight of methyl-hexahydrophthalic anhydride; about 0.5 parts by weight of benzyl dimethyl amine, about 1.0 part by weight of ethylene glycol, about 3 parts by weight of Triton X-100 (a surfactant) and about 0.08 parts by weight of nigrosine is prepared.

The composition is dispensed at a temperature of about 30° C. in the gap of about 5 mils between a silicon chip soldered by solder bumps to 28 mm by 28 mm Al$_2$O$_3$ substrate having pins protruding therefrom. The composition is cured at about 130° C. in about 4 hours. The cured composition has a coefficient of thermal expansion of less than $35 \times 10^{-6}/°C$. The composition covers the pin heads and solder bumps.

EXAMPLE 3

A composition containing about 400 parts by weight of 3,4-epoxycyclohexylmethyl-3,4-epoxycyclohexanecarboxylate (Union Carbide ERL-4221); about 990 parts by weight of fused silica available under the trade designation DP4910 from PQ Corporation, and having a particle size of 31 micrometers maximum and being free of alpha particle emissions; about 396 parts by weight of hexahydrophthalic anhydride; about 4.0 parts by weight of ethylene glycol; about 25.2 parts by weight of Triton X-100 and about 1.4 parts by weight of Orasol Blue GN is prepared. The composition is mixed under vacuum at less than 5 mm Hg using a high shear mixer. The composition cured at 130° C. for about 5 hours has a coefficient of thermal expansion at about $33 \times 10^{-6}/°C$.

EXAMPLE 4

A composition containing about 100 parts by weight of Bisphenol AD dicyanate available from Hi-Tek Polymers as AROCY L10; about 145 parts by weight of fused silica available under the trade designation DP4910 from PQ Corporation, and having a particle size of 31 micrometers maximum and being free of alpha particle emissions; about 3 parts by weight of Triton X-100 (a non-ionic surfactant), about 0.2 parts by weight of zinc octanoate (8% zinc in mineral spirits), and about 0.1 parts by weight of Orasol blue GN is prepared.

The composition is dispensed at a temperature of about 30° C. in the gap of about 5 mils between a silicon chip soldered by solder bumps to 28 mm by 28 mm Al$_2$O$_3$ substrate having pins protruding therefrom. The composition covers the pin heads and solder bumps. The composition is cured at about 200° C. in about 2 hours. The composition has a coefficient of thermal expansion of less than $32 \times 10^{-6}/°C$.

What is claimed is:

1. A solder interconnection for forming connections between an integrated semiconductor device and a carrier substrate comprising
    a plurality of solder connections that extend from the carrier substrate to electrodes on said semiconductor device to form a gap between said carrier substrate and the semiconductor device, wherein said gap is filled with a composition obtained from curing a composition containing:
    A. a binder selected from the group of cycloaliphatic polyepoxide, cyanate ester, prepolymer of cyanate ester and mixtures thereof, said binder having a viscosity at room temperature of no greater than about 1,000 centipoise;
    B. filler having a maximum particle size of 31 microns and being substantially free of alpha particle emissions; wherein the amount of A is about 60 to about 25% by weight of the total of A and B and correspondingly, the amount of B is about 40 to about 75 percent by weight based upon the amount of A and B, and C a surfaeta.

2. The solder interconnection of claim 1 wherein said gap is about 50 to about 160 microns wide.

3. The solder interconnection of claim 1 wherein said binder is a polyepoxide selected from the group of 3,4-epoxycyclohexylmethyl-3,4-epoxycyclohexane carboxylate and vinyl cyclohexane diepoxide.

4. The solder interconnection of claim 1 wherein said binder is a polyepoxide that includes 3,4-epoxycyclohexylmethyl-3,4-epoxycyclohexane carboxylate.

5. The solder interconnection of claim 1 wherein the viscosity of said binder at 25° C. is about 35 to about 500 centipoise.

6. The solder interconnection of claim 1 wherein said filler is an inorganic filler selected from the group of silica, quartz and fused silica, optionally treated with coupling agents.

7. The solder interconnection of claim 1 wherein said filler has emission rate of less than 0.01 alpha particles/$cm^2$-hr.

8. The solder interconnection of claim 1 wherein said filler has particle sizes of about 0.5 to about 20 micrometers.

9. The solder interconnection of claim 1 wherein said amount of said binder is about 43% by weight and said amount of said filler is correspondingly about 57% by weight.

10. The solder interconnection of claim 1 wherein said composition also includes an anhydride of an organic carboxylic acid hardener.

11. The solder interconnection of claim 10 wherein said hardener includes hexahydrophthalic anhydride or methyl hexahydrophthalic anhydride or mixtures thereof.

12. The solder interconnection of claim 10 wherein the amount of the hardener is about 89 to about 110 phr.

13. The solder interconnection of claim 1 wherein the viscosity at 25° C. of said composition is about 3,000 to about 17,000 centipoise.

14. The solder interconnection of claim 1 wherein said composition also includes a catalyst.

15. The solder interconnection of claim 1 wherein said composition also includes ethylene glycol in an amount of about 0.5 to about 2 phr.

16. The solder interconnection of claim 1 wherein said composition is free of unreactive organic solvents.

17. The solder interconnection of claim 1 wherein said composition also includes an adhesion promoter.

18. The solder interconnection of claim 1 wherein said substrate is an organic, inorganic or a composite material.

19. The solder interconnection of claim 1 wherein said binder is a cyanate ester.

20. The solder interconnection of claim 19 wherein said syanate ester is 4,4'-ethylidene bisphenol dicyanate.

21. The solder interconnection of claim 1 wherein the amount of said surfactant is about 0.5% to about 3% by weight of the composition.

22. The solder interconnection of claim 1 wherein the amount of said surfactant is about 1.2% to about 1.6% by weight of the composition.

23. The solder interconnection of claim 1 wherein said surfactant is a silane.

24. The solder interconnection of claim wherein said surfactant is a non-ionic surface active agent.

* * * * *